United States Patent

Kennedy et al.

[11] 4,061,510
[45] * Dec. 6, 1977

[54] PRODUCING GLASS PASSIVATED GOLD DIFFUSED RECTIFIER PELLETS

[75] Inventors: Richard W. Kennedy, Skaneateles; Edward G. Tefft, Auburn, both of N.Y.

[73] Assignee: General Electric Company, Auburn, N.Y.

[*] Notice: The portion of the term of this patent subsequent to Mar. 2, 1993, has been disclaimed.

[21] Appl. No.: 654,282

[22] Filed: Feb. 2, 1976

Related U.S. Application Data

[63] Continuation-in-part of Ser. No. 405,489, Oct. 11, 1973, Pat. No. 3,941,625.

[51] Int. Cl.² .......................................... H01L 21/225
[52] U.S. Cl. .................................... 148/187; 148/188
[58] Field of Search ........................ 148/187, 175, 188

[56] References Cited

U.S. PATENT DOCUMENTS

| 3,427,708 | 2/1969 | Schutze et al. | 148/187 X |
| 3,579,815 | 5/1971 | Gentry | 148/175 X |
| 3,617,398 | 11/1971 | Bilous | 148/187 X |
| 3,640,783 | 2/1972 | Bailey | 148/186 |
| 3,806,361 | 4/1974 | Lehner | 148/175 X |

Primary Examiner—G. Ozaki
Attorney, Agent, or Firm—R. J. Mooney; S. B. Salai

[57] ABSTRACT

Disclosed is a rectifier pellet and a method for the fabrication thereof. A layer of oxide is grown on a semiconductor wafer that has been diffused to form a plurality of rectifier pellets, and openings are etched in the oxide at locations corresponding to each pellet. Gold is diffused through the openings into a preselected distribution to reduce turnoff time. Grooves are etched to facilitate glass passivation and division of the wafer into pellets.

9 Claims, 7 Drawing Figures

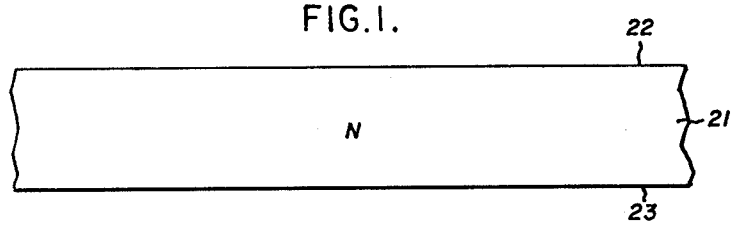
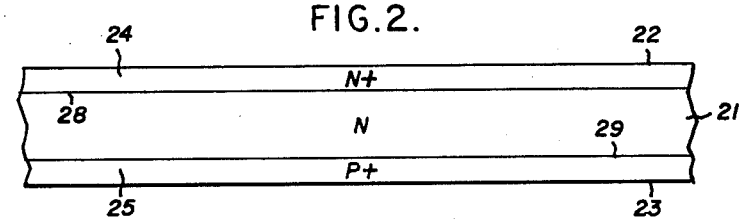
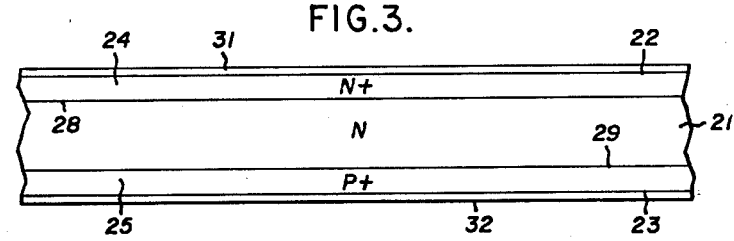
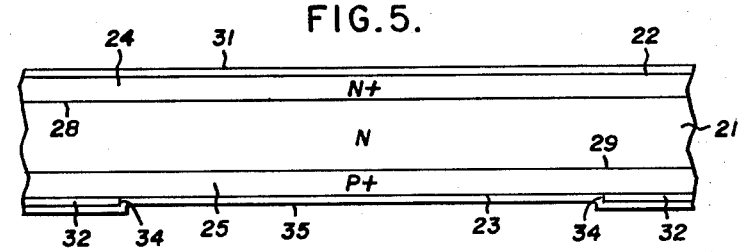
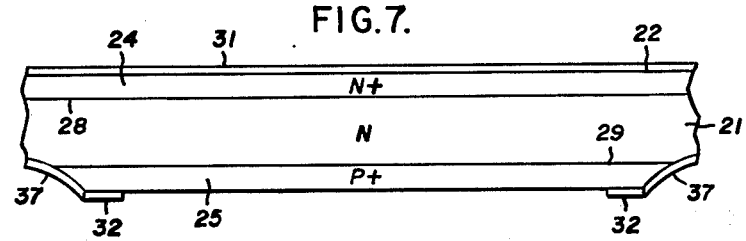
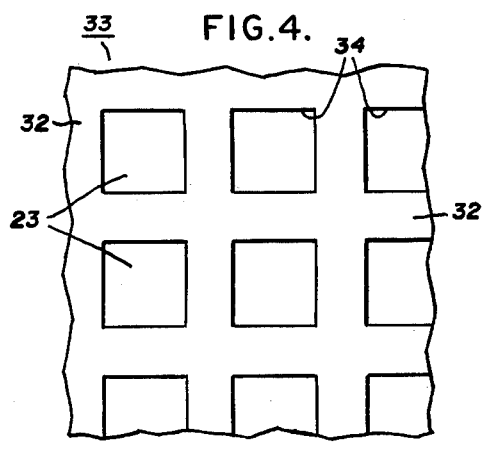
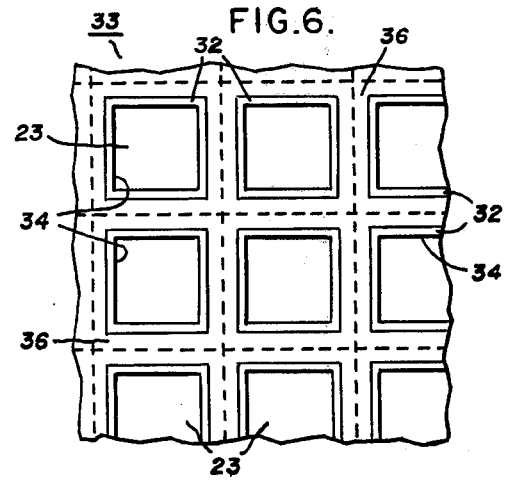

4,061,510

PRODUCING GLASS PASSIVATED GOLD DIFFUSED RECTIFIER PELLETS

This application is a continuation in part of our co-pending application entitled "Glass Passivated Gold Diffused SCR Pellet and Method for Making", filed Oct. 11, 1973, and assigned Ser. No. 405,489 now Pat. No. 3,941,625.

BACKGROUND OF THE INVENTION

This invention relates to rectifiers and, more particularly, to gold doped fast turnoff rectifiers.

Since their introduction, power semiconductors have become more popular as circuit designers have continued to employ them in new and different ways. As new applications for these devices are developed, greater emphasis is placed on improving their performance under demanding conditions of operation. Different applications require that the emphasis be placed on different characteristics of the devices. For example, some potential applications will become commercially feasible only if the cost of the components can be reduced. Other applications require that they devices be able to withstand higher reverse voltages or that they switch from a conductive to a non-conductive state more rapidly. Thus, the device designer is faced with a multi-faceted problem.

One of the principal problems facing the device designer is the interrelationship among the various device characteristics. For example, it is known that if gold is diffused into the interior $n$-doped region of a power semiconductor, the minority carrier lifetime in that region is decreased, and thus the turnoff time is reduced. However, the affect of the gold diffusion step on the cost of the device must be considered. Also, it is known that glass passivation of semiconductor pellets has many beneficial effects. For example, the reverse voltage characteristics are improved as is device reliability. Furthermore, glass passivation improves the manufacturing yield and thus reduces cost. Consequently, a device exhibiting desirable properties could seemingly be made by utilizing both gold diffusion and glass passivation techniques. However, this has not heretofore been possible. This is so for the following reason. Glasses used with semiconductors melt at a lower temperature than that required to perform the gold diffusion. Thus, the glass passivation step must be performed following the gold diffusion step. But, the glass passivation process includes an oxide growing step which is performed at a high enough temperature to cause uncontrollable migration and redistribution of the gold. Thus, heretofore, selectively localized gold doping and glass passivation have been considered incompatible operations. Consequently, gold doped power semiconductors are generally manufactured by a process including blanket gold diffusion of an entire wafer followed by pelletization and individual passivation with silicone rubber.

It is an object of this invention, therefore, to provide a power semiconductor with gold doping and glass passivation, and, to disclose a method for making such a device.

SUMMARY OF THE INVENTION

This invention is characterized by a rectifier pellet of semiconductor material that defines two major surfaces and defines a $p$-$n$ junction. An auxiliary impurity that stimulates carrier recombination, such as gold or platinum, is selectively diffused into the pellet and is preferably included near the junction. The pellet is passivated, and thus a rectifier is provided that exhibits the reliability in operation and repeatability and economy of manufacture associated with passivated devices and, furthermore, exhibits the rapid turnoff charcteristics associated with gold doped devices.

A preferred method for fabricating the subject rectifier includes the steps of thermally growing an oxide on at least one of the two major surfaces of a semiconductor wafer that has been suitably doped to render it divisible into a number of rectifier pellets. Portions of the oxide overlying the pellets are selectively removed to form windows. Gold, or another dopant that stimulates the recombination of charge carriers, is diffused through the windows into the area near the P/N junction. Thus, there is provided a semiconductor wafer suitably doped to form a plurality of rectifier pellets, wherein each pellet has been doped with an auxiliary impurity such as gold. Furthermore, oxide remains on the wafer where it is to be grooved. Consequently, no more oxide need be grown to permit the etching of grooves to facilitate passivation and pellet division.

DESCRIPTION OF THE DRAWINGS

These and other features and objects of the present invention will become more apparent upon a perusal of the following description taken in conjunction with the accompanying drawings wherein:

FIG. 1 is a sectional elevation view of a portion of a semiconductor crystal wafer;

FIG. 2 is a view of the wafer depicted in FIG. 1 following diffusion steps to be described below;

FIG. 3 is a view of the wafer depicted in FIGS. 1 and 2 following an oxidation step;

FIG. 4 is a plan view of the lower surface of the wafer after openings have been etched in the oxide;

FIG. 5 is an elevation view of the wafer shown in FIG. 4;

FIG. 6 is a lower plan view of the wafer during a later processing step; and

FIG. 7 is an elevation view of the wafer shown in FIG. 6.

DESCRIPTION OF THE PREFERRED EMBODIMENT AND METHOD

Referring first to FIG. 1 there is shown an elevation view of a body of semiconductor material 21 which is only a portion of a larger semiconductor wafer such as is conventionally used in the manufacture of semiconductor products. The material 21 is doped with an impurity such as arsenic or phosphorus so that it is of $n$-type conductivity and defines first and second major surfaces 22 and 23, respectively.

Referring now to FIG. 2, another impurity, such as gallium or boron, is diffused into the body 21 from the second major surface 23, thus providing a layer 25 of $p+$ type conductivity adjacent the major surface 23. Next, an impurity such as phosphorus or arsenic is diffused into the first major surface 22 to form a layer 24 of $n+$ type conductivity adjacent thereto. These processes are conventional in the fabrication of rectifiers. It will be observed that the body of semiconductor material now defines a P/N junction 29 and a juncture 28, each substantially parallel to the major surfaces 22 and 23.

The body of semiconductor material 21 is then exposed to a temperature of above approximately 1100° C to form layers of oxide 31 and 32 on the upper and lower major surfaces 22 and 23, respectively. This is shown in FIG. 3. Only the oxide layer 32 need be grown. However, it is generally easier to form a layer of oxide 31 on the upper major surface 22 simultaneously.

Referring now to FIG. 4, there is shown a small portion of the wafer 33 of which the body 21 is a part. A plurality of openings or windows 34 are etched in the lower layer of oxide 32 as shown in FIG. 4. Thus, portions of the lower major surface 23 are exposed. One opening 34 is located in each area where the active device region of a rectifier pellet is to be cut from the wafer 33. However, the openings 34 preferably do not span the entire area of the pellets for reasons to be discussed below.

The lower portion of the wafer 33 is then coated with an auxiliary impurity. The auxiliary impurity is one that stimulates recombination of charge carriers. In the preferred method, an auxiliary impurity such as gold is vapor deposited on the entire lower surface. Thus as shown in FIG. 5, gold 35 is deposited on the remaining oxide 32 and on the portions of the lower surface 23 that are exposed by the windows 34.

Next, the body 21 is exposed to a temperature in the range of approximately 750° to 950° C to cause the auxiliary impurity 35 to diffuse in a preselected distribution into the wafer. Temperature and time are preferably chosen so that the gold diffuses at least into the junction 29. Following the diffusion step, the openings 34 are masked with a protective coating at a relatively low temperature. For example, in a preferred method a lacquer or a wax is applied However, if the grooves to be subsequently formed are relatively shallow, a photoresist mask will adequately protect the openings 34.

Referring now to FIGS. 4 and 6, it will be observed that broad "avenues" of oxide define the windows 34. The "avenues" are sufficiently broad that no new oxide need be grown to groove. Intersecting elongated areas 36 are located in the "avenues" by photoresist techniques. The oxide 32 in the elongated areas 36 is removed. Grooves are then etched in the exposed areas 36. The lacquer or wax protects the lower major surface 23 in the windows 34 and thus no etching takes place through the windows.

It is felt beneficial to define the areas through which grooves are to be etched with a layer of oxide inasmuch as location can be more precisely determined and more precisely delineated. Thus, an advantage of not extending the windows 34 to the peripheries of the pellets will be understood.

Referring now to FIG. 7, which is an elevation view similar to FIGS. 1–3 and 5 of a single rectifier pellet, the grooves on the lower major surface 23 are shown. It is clear that the P/N junction 29 is intersected by the grooves. Furthermore, it will be apparent upon a comparison of FIGS. 6 and 7 that the junction 29 is intersected on all sides by grooves. Thus passivation is facilitated.

Passivation is performed as follows: First, the lacquer or wax is removed from the openings 34 because it is an organic substance and could release vapors harmful to the passivation process. Next, glass in a particulate form and suspended in alcohol is applied to the surfaces of the wafer 33. The glass will not stick to the oxide layers 31 and 32. Thus, it is appreciated that by covering the upper major surface 22 with oxide 31, economy is promoted inasmuch as glass does not adhere thereto. Following the deposition of the particulate glass in the grooves, a relatively low temperature heat is applied to evaporate the alcohol. When the alcohol has evaporated, the wafer 33 is exposed to a temperature of approximately 700° C to fuse the glass into a passivating layer 37 as shown in FIG. 7. If desired, an organic passivant can be employed in the grooves, either alone or surmounting a layer of glass.

Contacts are applied to the wafer in a conventional way. Division of the wafer 33 is performed by a conventional method such as laser scribing along the grooves as shown by the broken lines in FIG. 6. When the wafer 33 has been divided, the individual rectifier pellets, such as the pellet shown in FIG. 7, are formed. Comparison of FIGS. 6 and 7 will make plain that the passivation layer extends around the entire periphery of each pellet.

It will be appreciated that the gold undergoes sufficient lateral diffusion that it is disposed in the entire conduction area of the pellet, not just adjacent the openings 34. Therefore, carrier lifetime is reduced across the entire conduction area of the pellet and the resulting rectifier will exhibit the desirable fast turnoff property. Furthermore, a review of the above described method will show that the previous incompatibility between selective gold diffusion and glass passivation has been eliminated because each successive heating step is carried out at a lower temperature than the last. Thus, the wafer 33 is first oxidized at the 1100° temperature. Next, gold diffusion takes place at the substantially lower temperature of only 800° to 900° C. Finally, the glass is fused at 700° C, a temperature low enough that the selective gold distribution is not significantly affected.

It should be understood that the above is exemplary only, and many variations are possible. For example, the wafer could originally be p-type material and the rectifiers formed could be p+pn+. Inasmuch as it is desired to diffuse the auxiliary impurity into the junction area, and the junction is closer to the wafer surfaces overlying the n+ layer, the diffusion and passivation would take place from the n+ surface.

Compatibility of the auxiliary dopant and the conductivity modifying dopant should be considered. For example, phosphorus can be used to form the n+ layer, but phosphorus acts as a sink for gold. Thus, if the device is phosphorous doped, it may be best to diffuse the auxiliary impurity into the p+ layer. However, these compatibility considerations are known in the prior art and need not be discussed here.

In view of the foregoing, many modifications and variations of the present invention will be obvious to those skilled in the art. For example, platinum can be used in place of gold. Consequently, the true scope of the invention is only as defined by the following claims.

What is claim is:

1. A method of manufacturing semiconductor rectifier pellets comprising the steps of:
   providing a semiconductor wafer defining first and second laterally extending major surfaces, said wafer being of a size sufficient to form a plurality of laterally spaced rectifier pellets; wherein the region immediately underlying said first surface is of N-type conductivity and said wafer has a P/N junction therein extending laterally through said pellets;
   forming an oxide layer on one of said major surfaces at an elevated oxide-forming temperature;
   forming a plurality of laterally spaced openings in said oxide layer with said openings being located respectively in the areas overlying the active device regions of said pellets;

diffusing an auxiliary impurity into said device regions through said openings at an elevated diffusion temperature below said oxide-forming temperature, said auxiliary impurity being one which is selected to decrease carrier lifetime in said pellets;

masking said openings;

forming a second set of openings in said oxide layer, said second set of openings exposing the areas of said wafer between said pellets;

etching grooves in said wafer through said second set of openings, said grooves intersecting said P/N junction and lying between said pellets; and providing a passivant material in said grooves covering the intersection of said junction with said grooves, said passivant material being provided at a temperature below said diffusion temperature.

2. A method according to claim 1 wherein said auxiliary impurity is selected from the group consisting of gold and platinum.

3. A method according to claim 2 wherein said passivant material comprises glass.

4. A method according to claim 3 wherein said glass is deposited in a particulate form and fused by the application of heat.

5. A method according to claim 3 wherein said step of masking said second openings comprises covering said openings with wax.

6. A method according to claim 1 wherein said step of masking said second openings comprises covering said openings with wax.

7. A method according to claim 1 wherein said step of masking said second openings comprises covering said openings with photoresist.

8. A method according to claim 1 wherein said wafer is of a P+PN+ configuration and said oxide layer is formed on said first surface.

9. A method according to claim 1 wherein said wafer is of a P+NN+ configuration and said oxide layer is formed on said second surface.

* * * * *